US007651903B2

(12) United States Patent
Jeon

(10) Patent No.: US 7,651,903 B2
(45) Date of Patent: Jan. 26, 2010

(54) CMOS IMAGE SENSOR AND METHOD FOR MANUFACTURING THE SAME

(75) Inventor: In Gyun Jeon, Gunpo-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 169 days.

(21) Appl. No.: 11/580,388

(22) Filed: Oct. 12, 2006

(65) Prior Publication Data

US 2007/0085119 A1    Apr. 19, 2007

(30) Foreign Application Priority Data

Oct. 13, 2005    (KR) .................. 10-2005-0096365

(51) Int. Cl.
*H01L 21/8238* (2006.01)
(52) U.S. Cl. .................. 438/200; 438/199; 438/649; 438/73; 257/E21.199
(58) Field of Classification Search .............. 438/649, 438/199, 79, 200; 257/E21.199
See application file for complete search history.

(56) References Cited

U.S. PATENT DOCUMENTS

| 5,068,736 | A |   | 11/1991 | Hamasaki |   |
|---|---|---|---|---|---|
| 5,202,287 | A | * | 4/1993 | Joshi et al. | 438/653 |
| 6,642,076 | B1 | * | 11/2003 | Yaung et al. | 438/48 |
| 2003/0146456 | A1 | * | 8/2003 | Hanson et al. | 257/213 |
| 2004/0217398 | A1 | * | 11/2004 | Lee | 257/292 |
| 2006/0125007 | A1 | * | 6/2006 | Rhodes | 257/346 |

FOREIGN PATENT DOCUMENTS

GB    2 222 909 A    3/1990

OTHER PUBLICATIONS

Korean publication machine translation No. 10-2002-0045450 to Kim et al.*
Chinese Office Action dated Jun. 27, 2008 and English Translation; Chinese Patent Application No. 2006101635977; The State Intellectual Property Office of the P.R.C., People's Republic of China.
German Office Action dated May 14, 2009 and English Translation; German Patent Application No. 10 2006 048 611.0-33; The German Patent and Trademark Office, Germany.

* cited by examiner

*Primary Examiner*—Davienne Monbleau
*Assistant Examiner*—Hajar Kolahdouzan
(74) *Attorney, Agent, or Firm*—The Law Offices of Andrew D. Fortney; Andrew D. Fortney

(57) ABSTRACT

Disclosed are a CMOS image sensor and a method for manufacturing the same, for reducing or preventing damage to a photodiode and improving a pixel design margin to achieve scale down of a pixel. The CMOS image sensor includes an isolation layer in a semiconductor substrate, a gate electrode crossing a part of the isolation layer and the active area, a photodiode area in the active area, an insulating sidewall spacer on sides of the gate electrode, a metal silicide layer on the gate electrode and at least part of a surface of the photodiode area adjacent to the gate electrode, a metal layer electrically connecting the gate electrode to the photodiode area, and a dielectric layer on the entire surface of semiconductor substrate.

16 Claims, 7 Drawing Sheets

CMOS IMAGE SENSOR AND METHOD FOR MANUFACTURING THE SAME

This application claims the benefit of Korean Application No. 10-2005-0096365, filed on Oct. 13, 2005, which is incorporated by reference herein in its entirety.

BACKGROUND OF THE INVENTION

1. Field of the Invention

The present invention relates to a CMOS (complementary metal oxide silicon) image sensor. More specifically, the present invention relates to a CMOS image sensor and a method for manufacturing the same, capable of simplifying the structure of the CMOS image sensor while achieving scale down of a pixel.

2. Description of the Related Art

In general, an image sensor is a semiconductor device for converting optical images into electric signals, and it may be classified as a charge coupled device (CCD) or a CMOS image sensor.

The CCD has a plurality of photodiodes (PDs), which are arranged in the form of a matrix in order to convert optical signals into electric signals. The CCD includes a plurality of vertical charge coupled devices (VCCDs) provided between photodiodes and vertically arranged in the matrix so as to transmit electrical charges in the vertical direction when the electrical charges are generated from each photodiode, a plurality of horizontal charge coupled devices (HCCDs) for transmitting the electrical charges from the VCCDs in the horizontal direction, and a sense amplifier for outputting electric signals by sensing the electrical charges being transmitted in the horizontal direction.

However, CCDs may have has various disadvantages, such as a complicated drive mode, high power consumption, and so forth. Also, the CDD is generally manufactured using multi-step photo processes, so the manufacturing process for the CCD can be complicated.

In addition, since it can be difficult to integrate certain circuits, such as a controller, a signal processor, and an analog/digital converter (AID converter) onto a single chip of the CCD, the CCD may not be advantageous for compact-size products.

Recently, the CMOS image sensor has been spotlighted as a next-generation image sensor capable of solving certain problems of the CCD.

The CMOS image sensor is a device employing a switching mode to sequentially detect an output of each unit pixel using MOS transistors, in which the MOS transistors are formed on a semiconductor substrate corresponding to the unit pixels through a CMOS technology. CMOS image sensors may also use peripheral devices, such as a controller and a signal processor.

That is, the CMOS sensor includes a photodiode and at least one MOS transistor in each unit pixel, and sequentially detects the electric signals of each unit pixel in a switching mode to realize images.

Since the CMOS image sensor makes use of the CMOS technology, the CMOS image sensor has advantages such as relatively low power consumption and a relatively simple manufacturing process with fewer photo processing steps.

In addition, the CMOS image sensor allows the product to have a compact size, because peripheral circuits such as a controller, signal processor, and A/D converter can be integrated onto the CMOS image sensor chip.

Therefore, CMOS image sensors have been extensively used in various applications, such as digital still cameras, digital video cameras, and so forth.

The CMOS image sensor is classified into a 3Tr-1PD type image sensor, 4Tr-1PD type image sensor, and 5Tr-1PD type image sensor depending on the number of transistors per unit pixel. The 3Tr-1PD type image sensor includes one photodiode and three transistors per unit pixel and the 4Tr-1PD type image sensor includes one photodiode and four transistors per unit pixel.

Hereinafter, description will be made in relation to a layout of a unit pixel and an equivalent circuit of a conventional 3Tr-1PD type image sensor.

FIG. 1 is an equivalent circuit schematic of the conventional 3Tr-1PD type image sensor, and FIG. 2 is a layout view illustrating the unit pixel of the conventional 3Tr-1PD type image sensor.

As shown in FIG. 1, the unit pixel of the conventional 3Tr-1PD type image sensor includes one photodiode PD and three NMOS transistors T1, T2 and T3.

A cathode of the photodiode PD is connected to a drain of the first nMOS transistor T1 and a gate of the second nMOS transistor T2.

In addition, sources of the first and second nMOS transistors T1 and T2 are connected to a power line that feeds a reference voltage VR, and a gate of the first nMOS transistor T1 is connected to a reset line that feeds a reset signal RST.

A source of the third NMOS transistor T3 is connected to a drain of the second nMOS transistor T2, a drain of the third nMOS transistor T3 is connected to a readout circuit (not shown) through a signal line, and a gate of the third nMOS transistor T3 is connected to a column select line that feeds a selection signal SLCT.

The first nMOS transistor T1 is a reset transistor Rx for resetting optical charges collected in the photodiode PD, the second nMOS transistor T2 is a source follower transistor Dx serving as a source follower buffer and/or amplifier, and the third NMOS transistor T3 is a select transistor Sx performing switching and addressing functions.

As shown in FIG. 2, an active area 10 is defined on the unit pixel of the conventional 3Tr-1PD type image sensor, so that one photodiode 20 is formed in a large-width part of the active area 10, and gate electrodes 30, 40 and 50 of three transistors T1, T2 and T3 overlap remaining parts of the active area 10, respectively.

That is, the reset transistor Rx corresponds to the gate electrode 30, the source follower transistor Dx corresponds to the gate electrode 40, and the select transistor Sx corresponds to the gate 50.

Dopants are implanted into the active area 10 of each transistor, except for portions below the gate electrodes 30, 40 and 50, thereby forming source/drain areas of each transistor.

Thus, an input terminal Vin that receives an external potential is provided in the source/drain area formed between the reset transistor Rx and the source follower transistor Dx, and an output terminal Vout which is connected to a readout circuit (not shown) is provided in the source/drain area formed at one side of the select transistor Sx.

FIG. 3 is a sectional view taken along line IV-IV' of FIG. 2 showing the conventional CMOS image sensor.

As shown in FIG. 3, the conventional CMOS image sensor includes an isolation layer 102 formed in an isolation area of a p-type semiconductor substrate 101 on which the active area and the isolation area are defined, a source follower transistor having a gate electrode 103 extending across a part of the isolation layer 102 and the active area, a photodiode area (PD) 105 formed on a part of the active area of the semiconductor substrate 101, a dielectric layer 45 formed on the entire surface of the semiconductor substrate 101, and a metal interconnection 46 on the dielectric layer 45 so as to electrically connect the gate electrode 103 with the photodiode area 105.

The metal interconnection 46 connects the gate electrode 103 with the photodiode area 105 through tungsten plugs 48 in contact holes formed through the dielectric layer 45 such that predetermined portions of surfaces of the gate electrode 103 and the photodiode area 105 are exposed.

According to the conventional CMOS image sensor having the above structure, since the photodiode area 105 is electrically connected to the gate electrode 103, a potential variation in the photodiode area 105 may exert an influence upon the gate potential of the source follower transistor Dx (see FIG. 1).

In addition, the gate potential may exert great influence upon the performance of the transistor.

However, in order to maximize the characteristics of the image sensor, it is necessary to directly transfer the potential variation of the photodiode area to a gate terminal of an adjacent transistor without potential loss.

Therefore, differently from other devices, a method of connecting a photodiode area to a gate electrode of an adjacent transistor is very important.

As mentioned above, according to the conventional connection method, contact holes are formed at upper portions of the photodiode area and the gate, and then tungsten plugs are formed by filling the contact holes with metallic materials. In this state, a metal layer such as an aluminum layer is deposited thereon and patterned to form a metal interconnection (e.g., metal interconnection 46 in FIG. 3).

However, the above connection method may cause damage to the photodiode when forming the contact hole in the photodiode area. In addition, since the photodiode area is connected to the gate electrode by means of the metal interconnection through four ohmic contacts, it can be challenging to improve the pixel design margin.

SUMMARY OF THE INVENTION

The present invention has been made to solve the above problems occurring in the related art, and therefore, it is an object of the present invention to provide a CMOS image sensor and a method for manufacturing the same, capable of reducing or preventing damage to the photodiode and improving a pixel design margin to enable scale down of the pixel.

According to one aspect of the present invention, there is provided a CMOS image sensor including a photodiode and a plurality of transistors, the CMOS image sensor comprising: an isolation layer in an isolation area of a semiconductor substrate; a gate electrode in an active area of the semiconductor substrate; a photodiode area in a part of the active area; an insulating sidewall spacer on sides of the gate electrode; a metal silicide layer on the gate electrode and a part of the photodiode area adjacent to the gate electrode; a metal layer electrically connecting the gate electrode to the photodiode area; and a dielectric layer on an entire surface of the semiconductor substrate including the metal layer and the metal silicide layer.

According to another aspect of the present invention, there is provided a method for manufacturing a CMOS image sensor including a photodiode and a plurality of transistors, the method comprising the steps of: forming an isolation layer in an isolation area of a semiconductor substrate; forming a gate insulating layer and a gate electrode on the active area; forming a photodiode area in a predetermined part of the active area; forming an insulating sidewall spacer on sides of the gate electrode; depositing a metal layer on an entire surface of the semiconductor substrate including the gate electrode; performing an annealing process to form a metal silicide layer on the substrate, the gate electrode, and an interfacial area of the photodiode area; selectively etching the metal layer except for a predetermined portion of the metal layer that electrically connects the gate electrode to the photodiode area; and forming a dielectric layer on an entire surface of the semiconductor substrate including the metal layer and the metal silicide layer.

DETAILED DESCRIPTION OF THE INVENTION

Hereinafter, a CMOS sensor and a manufacturing method thereof according to the present invention will be described in detail with reference to the following drawings.

Figure 1:
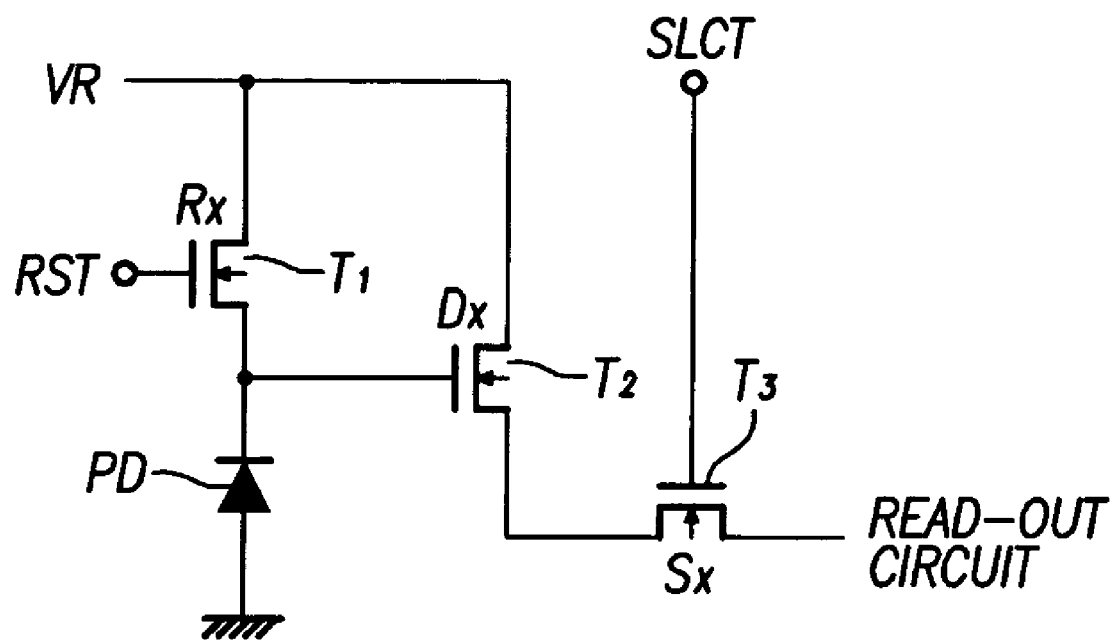
FIG. 1 is a circuit schematic of a conventional 3Tr-1PD type image sensor.
Figure 2:
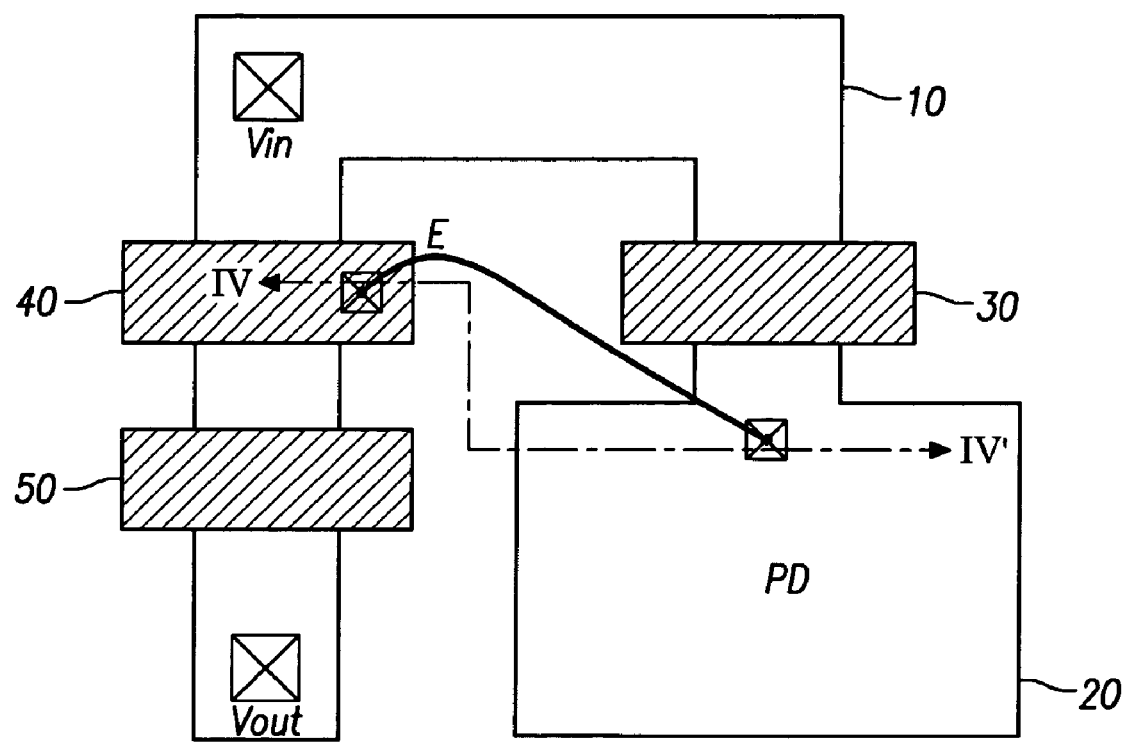
FIG. 2 is a layout view illustrating a unit pixel of the conventional 3Tr-1PD type image sensor.
Figure 3:
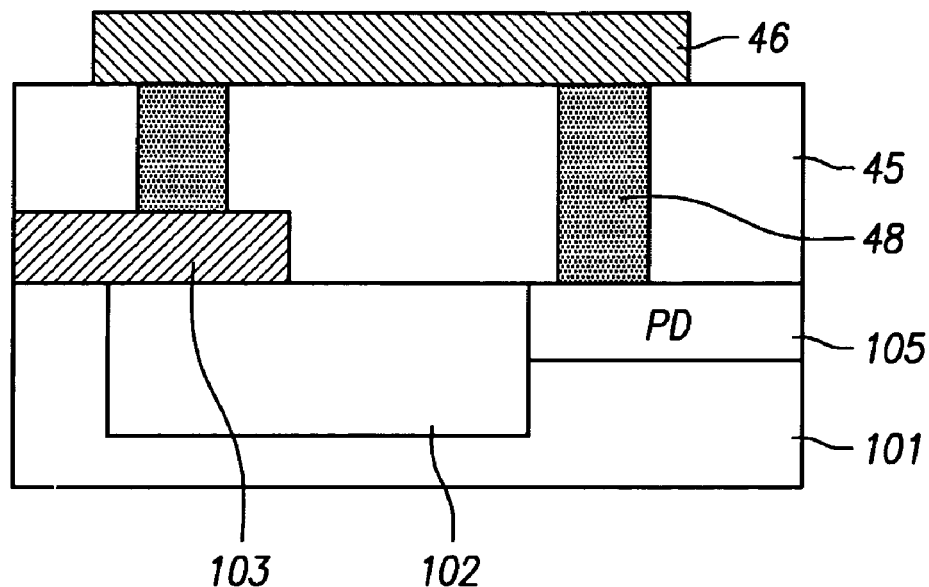
FIG. 3 is a sectional view taken along line IV-IV' of FIG. 2 to show the conventional CMOS image sensor.
Figure 4:
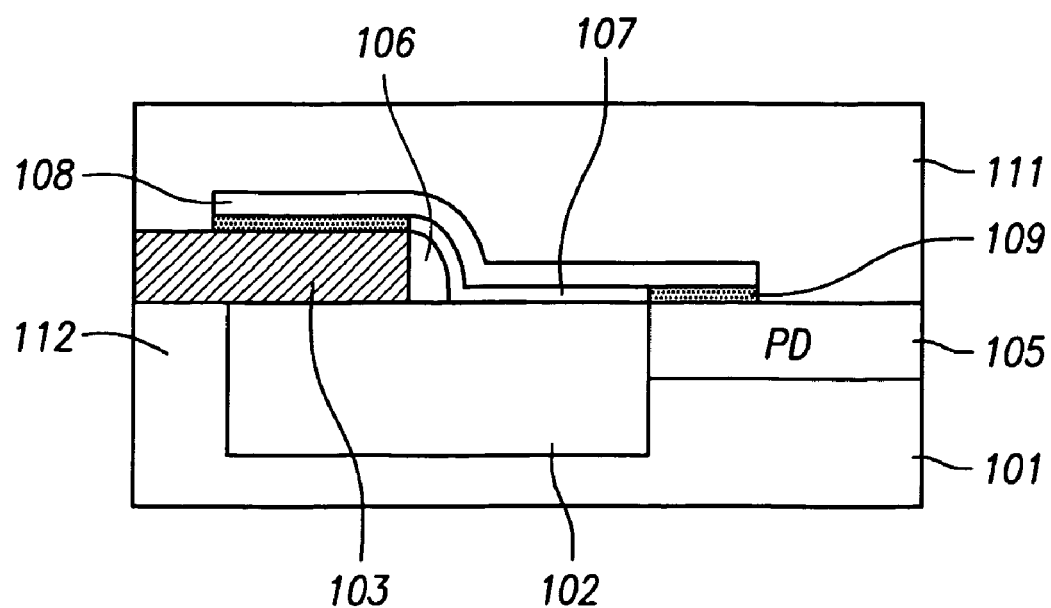
FIG. 4 is a sectional view taken along line IV-IV' of FIG. 2 to show a CMOS image sensor according to the present invention.

FIG. 4 is a sectional view taken along line IV-IV' of FIG. 2 to show the CMOS image sensor according to the present invention.

As shown in FIG. 4, the CMOS image sensor includes an isolation layer 102 formed in an isolation area of a p-type semiconductor substrate 101 having an active area 112 and the isolation area, a source follower transistor having a gate electrode 103 extending across a part of the isolation layer 102 and the active area 112, a photodiode area (PD) 105 formed in a part of the active area of the semiconductor substrate 101, an insulating sidewall spacer 106 formed at sides of the gate electrode 103, a metal silicide layer 109 formed on the top surface of the gate electrode 103 and a part of a surface of the photodiode area 105 adjacent to the gate electrode 103, a metal layer 107 electrically connecting the gate electrode 103 to the photodiode area 105, a barrier metal layer 108 formed on the metal layer 107 and the metal silicide layer 109, and a dielectric layer 111 formed on the entire surface of the semiconductor substrate 101 including the barrier metal layer 108. FIG. 4 shows only a portion of gate electrode 103 and active area 112; the entire gate 103 and active area 112 are not shown.

FIGS. 5a to 5g are sectional views showing the procedure for manufacturing the CMOS image sensor according to the present invention.

When a salicide process is performed after the transistors have been fabricated, the gate electrode is electrically connected to the photodiode by a salicide (e.g., self-aligned metal silicide) layer, so that certain damage to the photodiode is prevented.

Figure 5A:
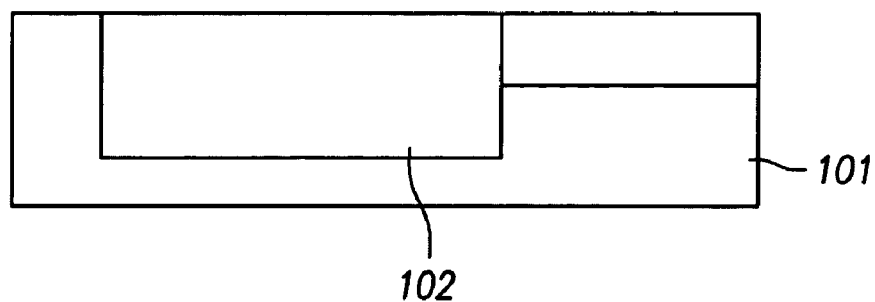
FIGS. 5a to 5g are sectional views showing a procedure for manufacturing a CMOS image sensor according to the present invention.

As shown in FIG. 5a, the isolation layer 102 is formed in the isolation area of the semiconductor substrate 101 in which the active area and the isolation area are defined.

Although it is not illustrated in the Figures, an exemplary method of forming the isolation layer 102 is as follows:

First, a pad oxide layer, a pad nitride layer and a TEOS (tetraethyl ortho silicate) oxide layer are sequentially formed on the semiconductor substrate. Then, a photoresist film is formed on the TEOS oxide layer.

After that, the photoresist film is subjected to the exposure and development process, and then is patterned using a mask having a pattern for defining the active and isolation areas. At this time, the photoresist film formed on the isolation layer is removed.

Then, the pad oxide layer, the pad nitride layer and the TEOS oxide layer, which are formed on the isolation layer, are selectively removed. At this time, the patterned photoresist film is used as a mask.

Subsequently, the isolation area of the semiconductor substrate is etched to a predetermined depth, thereby forming a trench. At this time, the patterned pad oxide layer, pad nitride layer and the TEOS oxide layer are used as an etch mask. Then, the photoresist film is completely removed.

After that, a sacrificial oxide layer is shallowly formed on the entire surface of the substrate having the trench, including along the inner wall of the trench, and then an $O_3$ TEOS layer is formed on the substrate such that the trench is filled with the $O_3$ TEOS layer. The $O_3$ TEOS layer may be formed at a temperature of 1000° C. or above.

Then, a CMP (chemical mechanical polishing) process is performed with respect to the entire surface of the semiconductor substrate in such a manner that the $O_3$ TEOS layer may remain only in the trench area, thereby forming the isolation layer 102 in the trench. After that, the pad oxide layer, the pad nitride layer, and the TEOS oxide layer are removed.

Figure 5B:
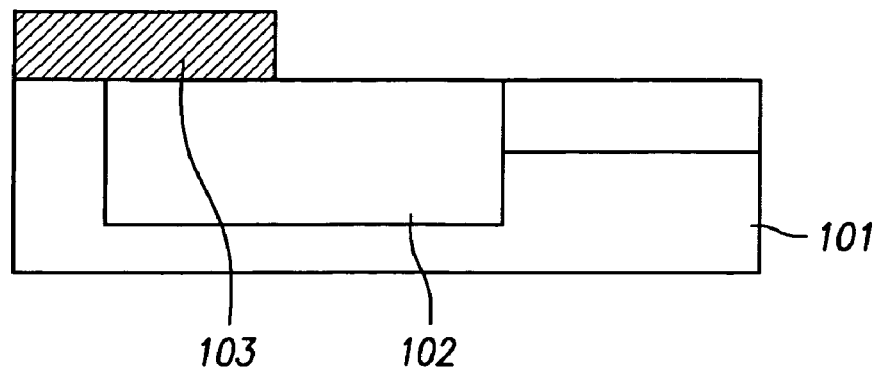

Then, as shown in FIG. 5b, a gate insulating layer (not shown) and a conductive layer (for example, a polycrystalline silicon layer) are sequentially deposited on the entire surface of the semiconductor substrate 101, and then the gate insulating layer and the conductive layer are selectively patterned and etched, thereby forming the gate electrode 103.

The gate electrode 103 serves as the gate electrode of the source follower transistor. Gate electrodes of other transistors are also formed simultaneously with the gate electrode 103 of the source follower transistor.

Figure 5C:
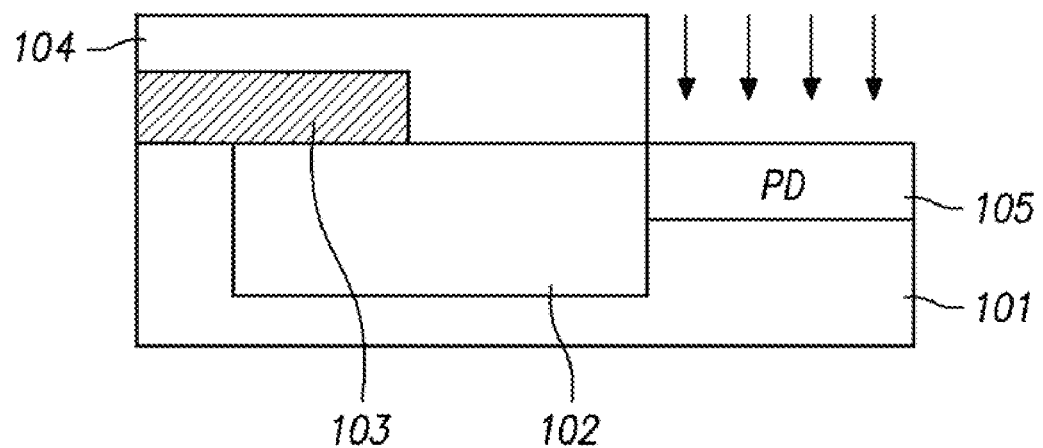

Then, as shown in FIG. 5c, a first photoresist film 104 is coated on the entire surface of the semiconductor substrate 101 including the gate electrode 103. After that, the first photoresist film 104 is selectively patterned through the exposure and development process in such a manner that a photodiode area can be defined in the active area.

Next, low-density dopants are implanted into the semiconductor substrate 101, thereby forming the photodiode area 105. At this time, the patterned first photoresist film 104 is used as a mask.

Figure 5D:
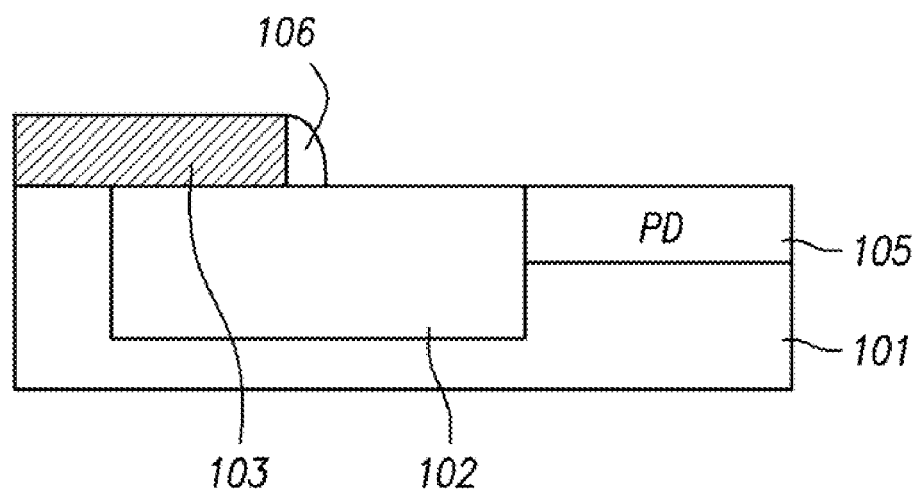

Then, as shown in FIG. 5d, after removing the first photoresist film 104, an insulating layer is formed on the entire surface of the semiconductor substrate 101. Thereafter, an etch back process (e.g., anisotropic and/or dry etching) is performed with respect to the entire surface of the resultant structure, thereby forming insulating sidewall spacer 106 at sides of the gate electrode 103. The insulating layer may comprise an oxide (e.g., silicon dioxide), a nitride (e.g., silicon nitride), or a combination thereof (e.g., a nitride-on-oxide bilayer, or an oxide-nitride-oxide stack). Since only one end of the gate 103 is shown in FIGS. 5D-5G, the sidewall spacer 106 on the opposite sidewall of the gate 103 is not shown.

In addition, although it is not illustrated in FIGS. 5D-5G, source/drain dopants are implanted into the semiconductor substrate 101 at opposite sides of the gate electrode 103 (e.g., in front of and behind the plane of the page), thereby forming source/drain diffusion areas.

Figure 5E:
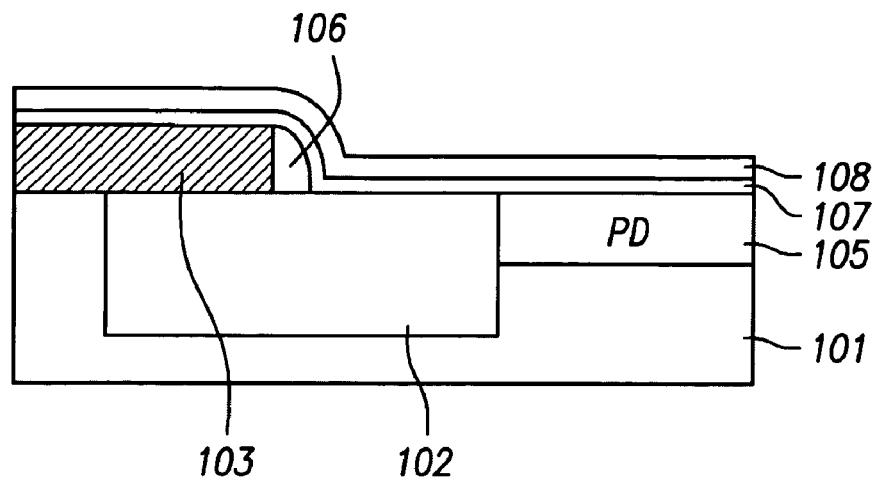

Then, as shown in FIG. 5e, a metal layer 107 for forming the salicide is deposited on the entire surface of the semiconductor substrate 101, including the gate electrode 103.

The metal layer 107 includes one or more metals selected from the group consisting of titanium (Ti), tantalum, (Ta), tungsten (W), molybdenum (Mo), nickel (Ni) and cobalt (Co), which can be changed into silicide when they react with the semiconductor substrate 101. Alternatively or additionally, a barrier metal layer 108 comprising TiN or TaN can be formed on the metal layer 107. In one embodiment, the barrier metal layer 108 is deposited by conventional chemical vapor deposition. Alternatively, the barrier metal layer 108 is formed by treatment with plasma comprising a nitrogen source or annealing in an atmosphere containing a nitrogen source. The nitrogen source may comprise nitrogen gas ($N_2$), ammonia ($NH_3$), hydrazine ($N_2H_4$), or a combination thereof.

In this case, the barrier metal layer 108 has a thickness of about 200 to 2000 Å. Also, the barrier metal layer may comprise a nitride of the metal layer.

Figure 5F:
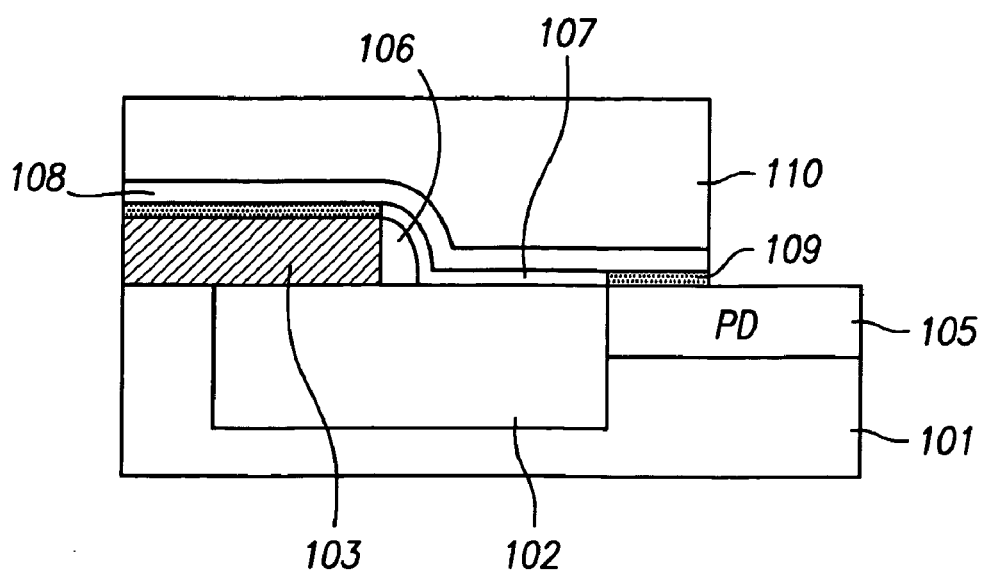

Then, as shown in FIG. 5f, the first annealing process is performed with respect to the semiconductor substrate 101 formed with the metal layer 107. The first annealing process continues for 30 seconds at a temperature of about 500° C. As a result, a metal silicide layer 109 is formed on the gate electrode 103 and the photodiode area 105.

After that, a second photoresist film 110 is coated on the semiconductor substrate 101. The second photoresist film 110 is selectively patterned through the exposure and development process.

Then, the barrier metal layer 108 and the metal layer 107, which do not react with the semiconductor substrate 101, are selectively removed by using the patterned second photoresist film 110 as an etch mask. Also, any metal silicide layer 109 exposed in the photodiode area 105 is also removed by selective etching. Alternatively, prior to silicidation/annealing, the second photoresist film 110 may be formed on the barrier metal layer 108 (if present) and the metal layer 107, and the metal layer 107 exposed in the photodiode area 105 is removed by selective etching.

At this time, the barrier metal layer 108 and the metal layer 107 covered with the second photoresist film 110 are not removed, but remain on the semiconductor substrate 101. The remaining part of the barrier metal layer 108 and the metal layer 107, which may be on a part or all of the gate electrode 103, may serve as a conductive connection line that electrically connects the gate electrode 103 with the photodiode area 105.

Figure 5G:
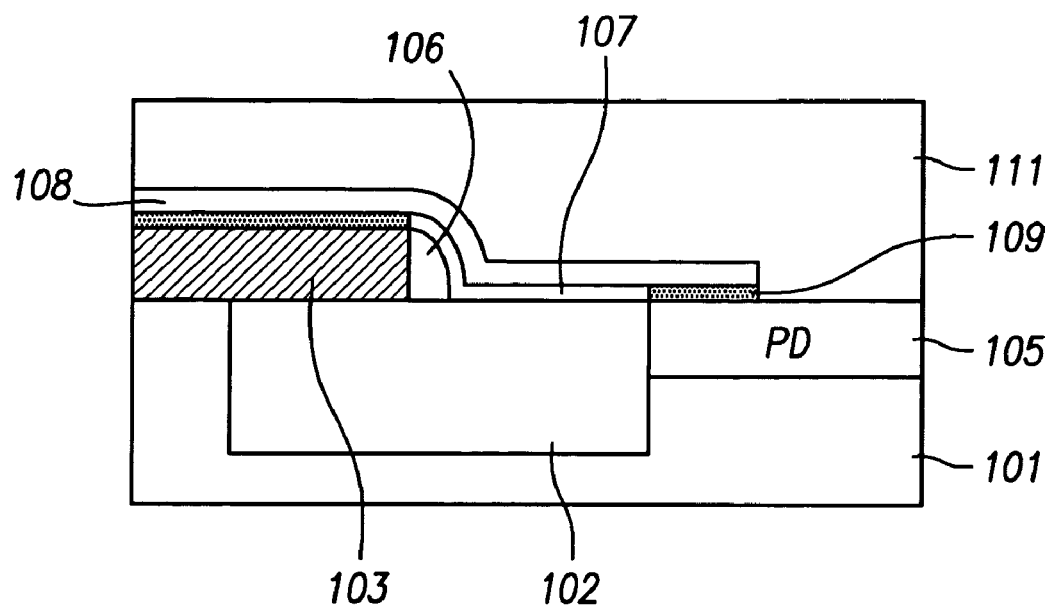

After that, as shown in FIG. 5g, the second photoresist film 110 is removed and then a second annealing process is performed with respect to the semiconductor substrate 101. The second annealing process continues for 60 seconds at a temperature of about 750° C. As a result, the metal silicide layer 109 is stabilized.

Then, a dielectric layer 111 is formed on the entire surface of the semiconductor substrate 101. Conventional contacts to gates and source/drain areas of the transistors in the unit pixel may be formed, but contacts to (and contact holes exposing) the photodiode region 105 and gate 103 can be avoided and/or omitted.

While the invention has been shown and described with reference to certain preferred embodiments thereof, it will be understood by those skilled in the art that various changes in form and details may be made therein without departing from the spirit and scope of the invention as defined by the appended claims.

As described above, the CMOS image sensor and the manufacturing method thereof according to the present invention have the following advantages.

First, the photodiode is directly connected to the gate electrode of an adjacent transistor through a silicide layer and a metal layer without using conventional contacts (e.g., tungsten plugs), so that the manufacturing process and the structure of the CMOS image sensor can be simplified, yields may be improved, and damage to the photodiode and/or gate may be avoided. Accordingly, the pixel design margin can be improved, so that the scale down of the pixel can be achieved.

What is claimed:

1. A method for manufacturing a CMOS image sensor including a photodiode and a plurality of transistors, the method comprising the steps of:
   forming an isolation layer in an isolation area of a semiconductor substrate having an active area and the isolation area;
   forming a gate insulating layer and a gate electrode in the active area;
   forming a photodiode in a predetermined part of the active area of the semiconductor substrate;
   forming an insulating sidewall spacer on sides of the gate electrode;
   depositing a metal layer on an entire surface of the semiconductor substrate including the gate electrode and the insulating sidewall spacer;
   forming a metal silicide layer on the gate electrode and an interfacial area of the photodiode by annealing the metal layer and the semiconductor substrate;
   selectively etching the metal layer except for a predetermined portion of the metal layer that electrically connects the gate electrode to a part of the interfacial area of the photodiode; and
   forming a dielectric layer on an entire surface of the semiconductor substrate including the metal layer and the metal silicide layer.

2. The method of claim 1, further comprising a step of forming a barrier metal layer on the metal layer.

3. The method of claim 2, wherein the barrier metal layer comprises TiN or TaN.

4. The method of claim 3, wherein the TiN or TaN has a thickness of about 200 to 2000Å.

5. The method of claim 2, wherein forming the barrier metal layer comprises depositing the barrier metal layer.

6. The method of claim 5, wherein the barrier layer is deposited by conventional chemical vapor deposition.

7. The method of claim 2, wherein the barrier metal layer comprises a nitride of the metal layer.

8. The method of claim 7, wherein forming the barrier layer comprises treating the metal layer with a plasma comprising a nitrogen source or annealing in an atmosphere containing a nitrogen source.

9. The method of claim 8, wherein the nitrogen source comprises nitrogen gas ($N_2$), ammonia ($NH_3$), hydrazine ($N_2H_4$), or a combination thereof.

10. The method of claim 2, wherein selectively etching the metal layer comprises coating a photoresist film on the barrier layer and selectively patterning the photoresist film through an exposure and development process.

11. The method of claim 10, further comprising selectively etching the barrier layer and the metal silicide layer on the photodiode exposed by the exposure and development process.

12. The method of claim 1, wherein the metal layer comprises a member selected from the group consisting of titanium (Ti), tantalum (Ta), nickel (Ni) and cobalt (Co).

13. The method of claim 1, wherein the gate insulating layer and the gate electrode are formed on a part of the isolation layer and the active area.

14. The method of claim 1, wherein the metal layer is deposited on an entire surface of the semiconductor substrate, further including the photodiode.

15. The method of claim 1, wherein prior to annealing, the method further comprises coating a photoresist film on the metal layer, developing the photoresist film, and selective etching removes the metal layer on the photodiode exposed by developing the photoresist film.

16. The method of claim 1, wherein selectively etching the metal layer leaves a portion of the photodiode covered by the predetermined portion of the metal layer and a remaining portion of the photodiode exposed.

* * * * *